(12) United States Patent
Louie et al.

(10) Patent No.: US 7,253,842 B2
(45) Date of Patent: Aug. 7, 2007

(54) LOCKING DISPLAY PIXEL CLOCK TO INPUT FRAME RATE

(75) Inventors: James Y. Louie, Daly City, CA (US); Menq Yu Shyu, Cupertino, CA (US)

(73) Assignee: Greenforest Consulting, Inc., Cupertino, CA (US)

( * ) Notice: Subject to any disclaimer, the term of this patent is extended or adjusted under 35 U.S.C. 154(b) by 3 days.

(21) Appl. No.: 11/182,102

(22) Filed: Jul. 14, 2005

(65) Prior Publication Data

US 2006/0012712 A1    Jan. 19, 2006

Related U.S. Application Data

(60) Provisional application No. 60/588,647, filed on Jul. 16, 2004.

(51) Int. Cl.
*H03L 7/00* (2006.01)
*H03B 19/00* (2006.01)

(52) U.S. Cl. ...................... 348/542; 348/547; 348/194; 327/119; 327/159

(58) Field of Classification Search ........ 348/537–538, 348/543–545, 542, 194, 607, 547, 497; 345/213; 331/20; 327/156, 159, 119; 377/47
See application file for complete search history.

(56) References Cited

U.S. PATENT DOCUMENTS

| | | | |
|---|---|---|---|
| 5,719,510 A * | 2/1998 | Weidner | 327/119 |
| 6,208,183 B1 * | 3/2001 | Li et al. | 327/161 |
| 6,987,424 B1 * | 1/2006 | Hein | 331/53 |
| 2005/0013343 A1 * | 1/2005 | Giunco et al. | 375/130 |

* cited by examiner

*Primary Examiner*—Victor R. Kostak
(74) *Attorney, Agent, or Firm*—Townsend and Townsend and Crew LLP

(57) ABSTRACT

To match the output frame rates to the input frame rates, a display clock signal is generated that has a frequency locked to the frequency of a reference clock signal. To generate the display clock signal, the period of the vertical incoming data clock is measured using the reference clock signal. The number of pixels disposed in the output frames is subsequently divided by the measured period. A fractional-N phase-locked loop circuit is adapted to multiply the result of the division with the frequency of the reference clock signal to generate the display clock signal. The display clock signal is also locked to the reference clock signal.

12 Claims, 1 Drawing Sheet

LOCKING DISPLAY PIXEL CLOCK TO INPUT FRAME RATE

CROSS-REFERENCES TO RELATED APPLICATIONS

The present application claims benefit under 35 USC 119(e) of U.S. provisional Application No. 60/588,647, filed Jul. 16, 2004, entitled "System And Method For Use In Video Processing Including A Programmable Input Device, A Pixel Clock Generator, And A Dual Scaler Architecture", the contents of which is incorporated herein by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to integrated circuits (ICs), and more particularly to video processor ICs adapted to provide matching rates between input and output video frames.

Incoming data received by a video processor typically has a different resolution than the data supplied by the video processor, thereby requiring format conversion. For example, incoming data frames may have a resolution of 680*480 pixels per frame, whereas the output frames may require, for example, a frame resolution of 1280*1024 pixels. In conventional systems, to attempt to match the input and output frame rates, a combination of display clock frequency, display width and display height is determined by trial and error. Pixels might be added to or subtracted from either the horizontal width or vertical height of the output frame while the output clock frequency is varied in small steps. In general, a group of such settings is predetermined to handle different combinations of input and display frame rates that a system is expected to encounter. Accordingly, in conventional systems, the matching of the input/output frame rates is approximate and susceptible to inaccuracies such as input signal deviation from standard specifications or circuit component variations. Furthermore, such matching is not automatic.

BRIEF SUMMARY OF THE INVENTION

To match the output frame rates to the input frame rates, a display clock signal is generated that has a frequency locked to the frequency of a reference clock signal. To generate the display clock signal, the period of the incoming vertical synchronization signal is measured using the reference clock signal. The number of pixels disposed in the output frames is subsequently divided by the measured period. A fractional-N phase-locked loop circuit is adapted to multiply the non-integer quotient of the division with the frequency of the reference clock signal to generate the display clock signal. The display clock signal is also locked to the reference clock signal. The display clock signal is used to display the output video frames.

Some embodiments of the present invention include, in part, a counter, a clock multiplier calculator, an averaging filter, a frequency limit controller, a phase-locked loop, and a delta-sigma modulator.

DETAILED DESCRIPTION OF THE INVENTION

Figure 1:
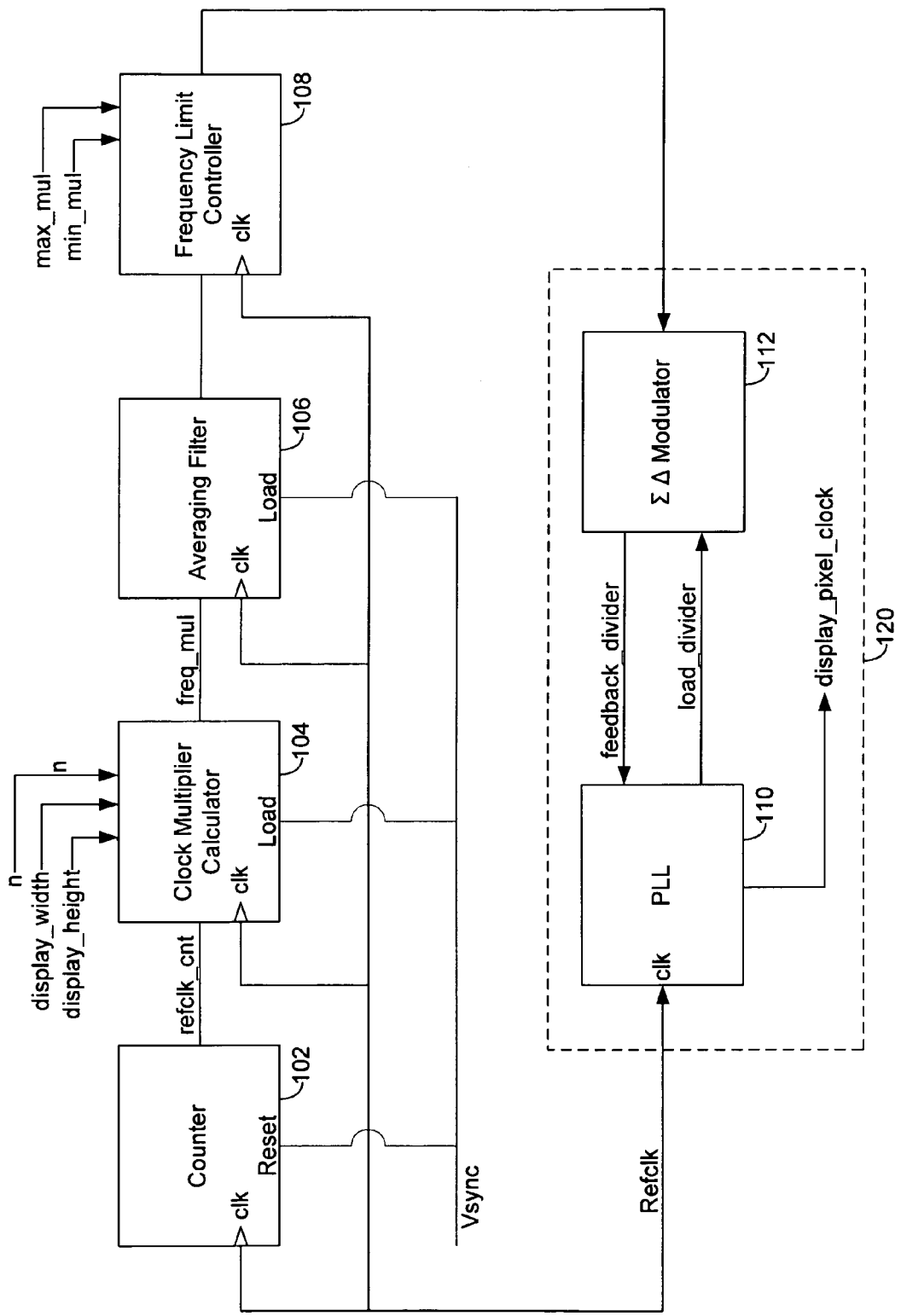
FIG. 1 is a high-level schematic diagram of various blocks disposed in a system adapted to match the rate of the output video frames to the input video frames, in accordance with one embodiment of the present invention.

To match the output frame rates to the input frame rates, a display clock signal is generated that has a frequency locked to the frequency of a reference clock signal. To generate the display clock signal, the period of the incoming vertical synchronization signal is measured using the reference clock signal. The number of pixels disposed in the output frames is subsequently divided by the measured period. A fractional-N phase-locked loop circuit is adapted to multiply the non-integer quotient of the division with the frequency of the reference clock signal to generate the display clock signal. The display clock signal is also locked to the reference clock signal. The display clock signal is used to display the output video frames.

FIG. 1 is a high-level schematic diagram of various blocks disposed in system 100 adapted to match the rate of the output video frames to the input video frames, in accordance with one embodiment of the present invention. System 100 is shown as including, in part, a counter 102, a clock multiplier calculator 104, an averaging filter 106, a frequency limit controller 108, a phase-locked loop (PLL) 110, and a delta-sigma modulator 112.

Reference clock signal Refclk is applied to the input clock terminal of each of counter 102, clock multiplier calculator 104, averaging filter 106, frequency limit controller 108, and analog PLL 110. Input vertical synchronization pulse signal (Vsync) is applied to the reset terminal of counter 102, and to load terminals of clock multiplier calculator 104, and averaging filter 106. Counter 102 is configured to increment its count upon each rising (or falling) transition of signal clk and is reset to zero when a rising (or falling) transition occurs on signal Vsync. Accordingly, counter 102 counts the period of signal Vsync and generates signal Refclk_cnt that represents this period. In other words, Refclk_cnt is the number of Refclk appearing during a cycle of signal Vsync. The counting process between successive Vsync periods is continuous so that any fractional Refclk period not included in the current Vsync count will be included in the next Vsync count. A highly accurate Vsync period can be obtained upon averaging multiple Vsync periods.

Assume that T_input represents the period of input vertical sync clock signal Vsync, T_display represents display (output) vertical sync period, T_clk represents the period of clock signal Refclk, f_clk represents the frequency of clock signal Refclk, T_dclk represents the display clock period, f_dclk represents the display clock frequency. To achieve input and display frequency lock, T_input and T_display must be equal. T_input may also be a multiple of T_display. Typical integer multiples are 1, 2, and 3. Input period is measured using the reference clock by counting the number of Refclk cycles occurring within an input vertical sync period, as shown below:

$$T\_input = Refclk\_cnt * T\_clk \quad (2)$$

Display vertical clock interval is related to the total number of pixels times the clock period, as shown below:

$$T\_display = T\_dclk * display\_width * display\_height \quad (3)$$

Combining (2) and (3), and noting that T_input and T_display are equal, the following is obtained:

$$Refclk\_cnt * T\_clk = T\_dclk * display\_width * display\_height \quad (4)$$

Rearrange as a clock period ratio, the following is obtained:

$$T\_dclk/T\_clk = Refclk\_cnt/(display\_width * display\_height) \quad (5)$$

Since period and frequency are inversely related, the following is obtained:

$$f\_dclk/f\_clk = (display\_width * display\_height)/Refclk\_cnt \quad (6)$$

Expressing the display clock frequency in terms of the reference clock frequency, the following is obtained:

$$f\_dclk = freq\_mul * f\_clk \quad (7)$$

The frequency multiplier parameter, freq_mul which is applied to the delta-sigma modulator 122, via averaging filter 106 and frequency limit controller 108, is obtained by factoring out f_clk, as shown below:

$$freq\_mul = (display\_width * display\_height)/ref\_cnt \quad (8)$$

Equation (8) may be modified, as shown below, to apply to more general cases:

$$freq\_mul = n*(display\_width*display\_height)/ref\_cnt \quad (9)$$

where n is an integer greater than or equal to 1.

As seen from FIG. 1, clock multiplier calculator 104 receives parameters display_height and display_width, as well as Refclk_cnt and generates frequency multiplier parameter, freq_mul, in accordance with equations (8) and (9) shown above.

Signal freq_mul is applied to averaging filter 106 that is adapted to perform an averaging function remove jitter from the signal it receives. The output signal of averaging filter 106 is applied to frequency limit controller 108. Frequency limit controller 108 is adapted to limit the frequency of the signal it receives to max_val if the received frequency exceeds max_val, and to limit the frequency of the signal it receives to min_val if the received frequency falls below max_val.

The output of frequency limit controller 108 is applied to delta-sigma modulator 112. Delta-sigma modulator 112 together with analog PLL 110 form a fractional-N PLL 120, as known to those skilled in the art. Fractional-N PLL 120 is adapted to multiply the frequency of reference clock signal Refclk by the output signal of frequency limit controller 108 and to generate clock signal display_pixel_clock that is used for the display of the frames. The frequency of signal display_pixel_clock is locked to the frequency of signal Refclk.

Although the above invention is described with reference to a video processor, it is understood the invention is equally applicable to any other system in which matching of input and output clock signals is required, notwithstanding the clock speed. At lower frequencies, the degree of jitter is significantly reduced.

The above embodiments of the present invention are illustrative and not limiting. Various alternatives and equivalents are possible. The invention is not limited to video processors and may be applied to other systems, such as audio processors, etc. The invention is not limited by the type of counter, clock multiplier calculator, averaging filter, frequency limit controller, delta-sigma modulator, or phase locked-loop. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. An integrated circuit comprising:
    a first block configured to determine a period of an input clock signal using a reference clock signal;
    a second block configured to receive the determined period and to generate a multiplier signal carrying a multiplier value; and
    a third block configured to multiply the reference clock signal frequency by the multiplier signal to generate a output clock signal, said third block further configured to lock the output clock signal to the reference clock signal, wherein said input clock signal is used for vertical synchronization of input frames.

2. The integrated circuit of claim 1 further comprising:
    a fourth block configured to remove jitter from the multiplier signal.

3. The integrated circuit of claim 2 further comprising:
    a fifth block configured to limit frequency range of signal generated by the fourth block.

4. The integrated circuit of claim 1 wherein said first block is a counter configured to receive the reference clock signal at its clock input terminal, and the input clock signal at its reset terminal.

5. The integrated circuit of claim 4 wherein said second block is a multiplier block configured to receive the clock input signal at its load terminal, and to receive signals carrying information regarding display frame's height display_height and width display_width, wherein said multiplier block is further configured to generate a multiplier freq_mul as defined below:

$$freq\_mul = n*(display\_width*display\_height)/Refclk\_cnt,$$

wherein Refclk_cnt represents the period of the input clock signal determined by the counter and n is an integer greater than or equal to 1.

6. The integrated circuit of claim 5 wherein said third block is a fractional-N phase-locked loop block.

7. The integrated circuit of claim 5 wherein said fractional-N phase-locked loop comprises a delta-sigma modulator.

8. The integrated circuit of claim 2 wherein said fourth block is an averaging filter.

9. A method of locking an output clock signal to an input clock signal, the method comprising:
    determining a period of the input clock signal using a reference clock signal;
    generating a multiplier signal carrying a multiplier value using the determined period;

multiplying the reference clock signal frequency by the multiplier signal to generate the output clock signal; and locking the output clock signal to the reference clock signal, wherein said input clock signal is used for vertical synchronization of input frames.

10. The method of claim 9 further comprising:

removing jitter from the multiplier signal to generate an intermediate signal.

11. The method of claim 10 further comprising:

limiting frequency range of the intermediate signal.

12. The method of claim 9 wherein said multiplier value freq_mul is generated as defined below:

$$freq\_mul = n*(display\_width*display\_height)/Refclk\_cnt$$

wherein Refclk_cnt represents the period of the input clock signal, display_height represents the height of the display frame, and display_width represents the width of the display frame, and n is an integer greater than or equal to 1.

* * * * *